United States Patent [19]

Pierce et al.

[11] Patent Number: 5,319,252

[45] Date of Patent: Jun. 7, 1994

[54] LOAD PROGRAMMABLE OUTPUT BUFFER

[75] Inventors: Kerry M. Pierce, Fremont; Roger D. Carpenter, Cupertino, both of Calif.

[73] Assignee: Xilinx, Inc., San Jose, Calif.

[21] Appl. No.: 973,365

[22] Filed: Nov. 5, 1992

[51] Int. Cl.⁵ .......................... G05F 3/08; H03K 5/12
[52] U.S. Cl. ...................... 307/263; 307/572; 307/592; 307/597
[58] Field of Search ............... 307/263, 315, 443, 571, 307/572, 579, 581, 584, 585, 592, 601, 296.6, 597; 323/265, 293

[56] References Cited

U.S. PATENT DOCUMENTS

| | | | |
|---|---|---|---|
| 4,701,635 | 10/1987 | Kawazoe et al. | 307/579 |
| 4,894,560 | 1/1990 | Chung | 307/443 |
| 4,906,871 | 3/1990 | Iida | 307/542 |

*Primary Examiner*—Timothy P. Callahan
*Assistant Examiner*—Shawn Riley
*Attorney, Agent, or Firm*—Edel M. Young

[57] ABSTRACT

The present invention reduces bounce in the power or ground supply voltages of an integrated circuit chip by gradually turning output drivers both on and off, so there is not a sharp discontinuity in current flow to an external device. Greatest current flow occurs at the middle of a transition period. The gradual turn-off at the end of a transition is achieved by feeding back voltage of the output signal to a device which controls the output driver. As output voltage approaches its final value, the output driver gradually turns off, preventing a sharp transient in the power or ground voltage of the integrated circuit chip.

9 Claims, 8 Drawing Sheets

LOAD PROGRAMMABLE OUTPUT BUFFER

FIELD OF THE INVENTION

The invention relates to output buffers for integrated circuit devices, more particularly to an output buffer which can be programmed differently to drive different types of load devices.

BACKGROUND OF THE INVENTION

Current process technology allows an output driver to generate rapid changes in output voltage. Fast transitions are desirable, but can lead to unwanted noise on internal power and ground busses. Since power and ground busses are coupled to internal logic signals, noise on the power and ground busses may cause erroneous states to be generated in the internal logic signals. Fast transitions can also cause ringing on the output pin signal, which may cause erroneous data to appear in a receiving device being driven by the output pin signal.

The fundamental cause of noise on the power and ground busses is due to the transition of the voltage level driving the load. FIG. 1 shows an output driver circuit 101 in combination with an output load device 106 driven through pad 105 and inductive elements 102 and 107 internal to the integrated circuit and additional inductive elements 103 and 108 comprising bond pads and wires connected to positive and negative power supplies, and printed circuit traces 104 and 109 external to the integrated circuit device. When the pad signal is a logical 1, transistor 101a is on, and a current $i_{TR}$ flows from the positive power supply through trace 104, bond wire 103, integrated circuit power line 102, transistor 101a, pad 105, to load 106. When transistor 101a suddenly shuts off, the induction of elements 104, 103, and 102 causes a voltage buildup, allowing $VCC_{INT}$, the internal power supply voltage, to be greater than $VCC_{EXT}$, the external power supply voltage. At this point, load 106 is at a positive voltage level, for example 5 volts. When transistor 101b suddenly turns on and current $i_{TF}$ begins to flow, the inductance of elements 107, 108, and 109 limits current flow and causes a voltage buildup across elements 107, 108, and 109, allowing $VSS_{ISNT}$ to be greater than $VSS_{EXT}$. Opposite variations in VCC and VSS occur due to opposite transitions of transistors 101a and 101b. When multiple transistors equivalent to transistors 101a and 101b switch simultaneously, the voltage variations on the power and ground busses can be unacceptably large, causing erroneous data to be generated internally. Erroneous data can also be generated at the load device in response to a fast transition.

Prior efforts to control power and ground bounce (variation in VCC and VSS voltages) have included a staged turn-on technique, a ramped pre-drive technique and a feedback circuit. These are now discussed.

FIG. 2A shows a prior art circuit for reducing variation in VCC and VSS levels by generating parallel drive signals with different delays in response to an unbuffered output signal. As shown in FIG. 2A, in the staged turn-on technique, the output driver is formed as a number of smaller drivers 203, 205, and 207 placed in parallel between VCC and VSS. Delay devices 204 and 206 cause delays to the driving signal on line 202 so that drivers 203, 205, and 207 switch at slightly different times, causing a more gradual voltage change at pad 208.

FIG. 2B shows a circuit which provides a ramped pre-drive. Weak pre-driver inverter 212 has a relatively small channel width and responds relatively slowly to a switching input signal. Thus driver 214 switches more slowly and therefore causes less bounce in VCC and VSS.

FIG. 2C shows an output driver with feedback to VCC and VSS. Resistors 223 and 225 limit current flow to and from pad 226. The feedback occurs because, for example, when the gate-to-source voltage difference at transistor 224b is high, transistor 224b is hard on. But a high current i from pad 226 through resistor 225 to VSS raises the voltage at the source of transistor 224b, turning transistor 224b partly off. As the voltage on pad 226 approaches the VSS voltage, current through resistor 225 decreases, so the source voltage of transistor 224b decreases, transistor 224b turns more on, and current continues to flow. A similar effect happens with resistor 223 and transistor 224a.

None of these prior art devices eliminates the ground bounce which occurs at the end of a switching transition.

SUMMARY OF THE INVENTION

The present invention takes into account the type of load being driven by the output driver in determining the drive characteristics. Some output loads are predominately capacitive, that is the load device behaves like a capacitor plate attached to the output terminal so there is no DC component (except for a transient just after switching occurs). Other output loads are predominantly resistive-capacitive, acting like a resistor and capacitor attached to the output terminal. These devices have a steady state DC component in addition to the transient just after switching occurs.

In the case of a resistive-capacitive load, the output is typically terminated by a resistor divider network. The resistor divider network reduces variation in the VCC and VSS voltages by initially limiting the amount of current, and at the end of the transition by maintaining the current. For this type of load, the output driver must be strong enough to switch the load quickly and to sink enough current to pull the resistor network voltage down to an acceptable level. Any of the prior art circuits work satisfactorily for resistive-capacitive loads.

In the case of a capacitive load, the current is supplied only from stored charge. At the end of a switching transition, with any of the prior art circuits discussed above, the inductors tend to maintain the current flowing, and the capacitor allows voltage to overshoot past the nominal power or ground voltage. None of the prior art circuits protect adequately against voltage variation from such a load.

According to the present invention, the drive capability of the output device is reduced as voltage approaches its intended level, thus gradually reducing current flow through the inductive elements. In one embodiment the output device is a P-channel transistor connected in series with an N-channel transistor where control of at least one transistor is by means of a two-input logic gate (such as an AND gate for an N-channel transistor or an OR gate for a P-channel transistor). The gate receives as one of its inputs the unbuffered output signal and as the other of its inputs the buffered and inverted output signal. In the case where the N-channel transistor is controlled by output of an AND gate, feeding back the buffered output to the AND gate causes the AND gate output to go low as the output device approaches its low level. This turns off the N-channel transistor gradually, so that current between the load and the VSS line changes gradually, and the inductive effect has much less influence on the VSS level.

In another embodiment, a multiplexer selects between turning off the transistor gradually and turning off in response to the unbuffered output signal directly. This embodiment uses a conventional circuit to operate with a resistive-capacitive load with resulting fast switching, and uses the gradual turn-off to operate with a capacitive load, with resulting reduced ground (or power) variation.

DETAILED DESCRIPTION OF SOME EMBODIMENTS OF THE INVENTION

Figure 3A:
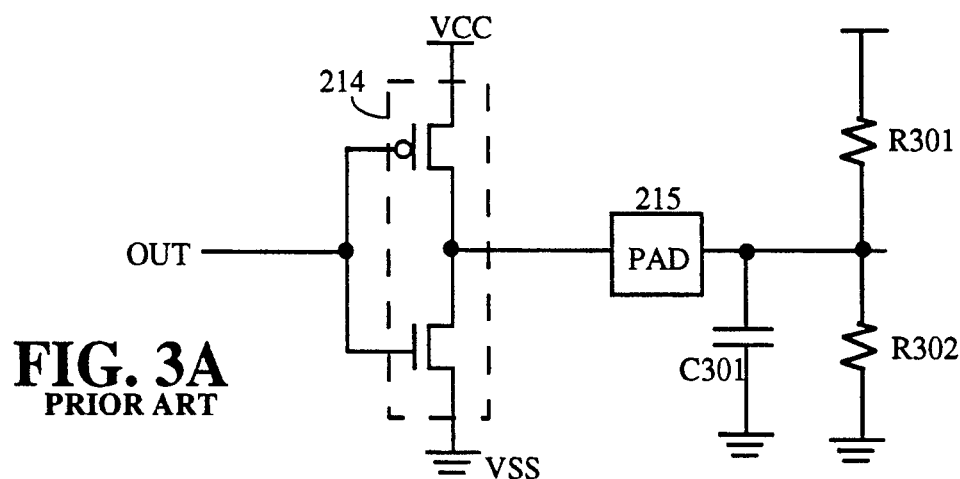
FIG. 3A shows a circuit representing a resistive-capacitive load.
Figure 3B:
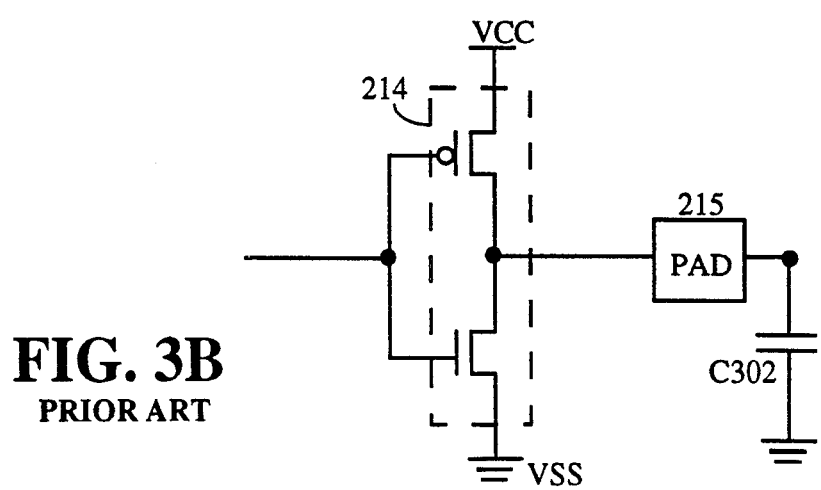
FIG. 3B shows a circuit representing a capacitive load.
Figure 2A:
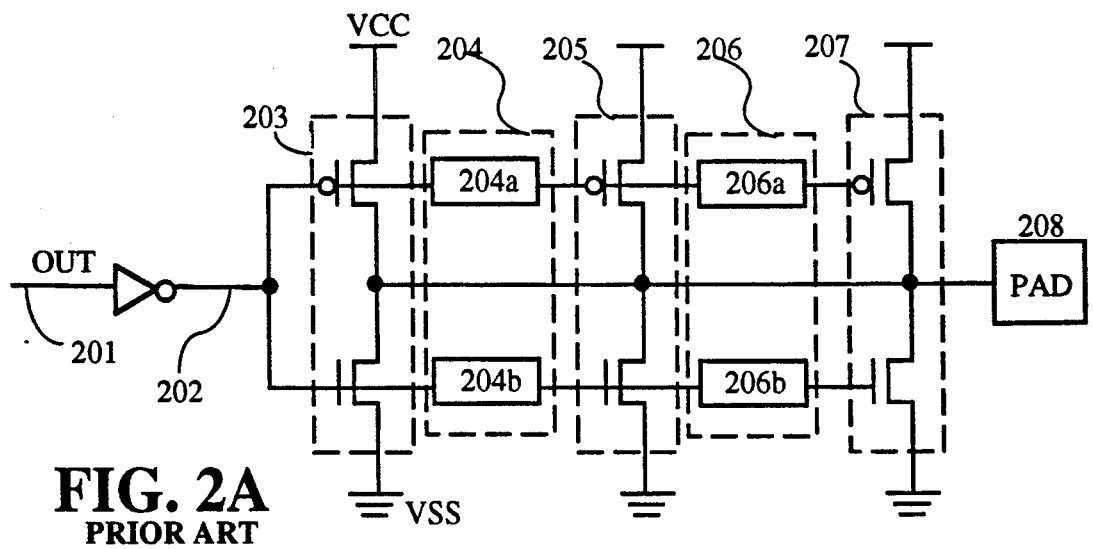
FIGS. 2A-2C show prior art circuits for controlling slew rate.
Figure 2B:
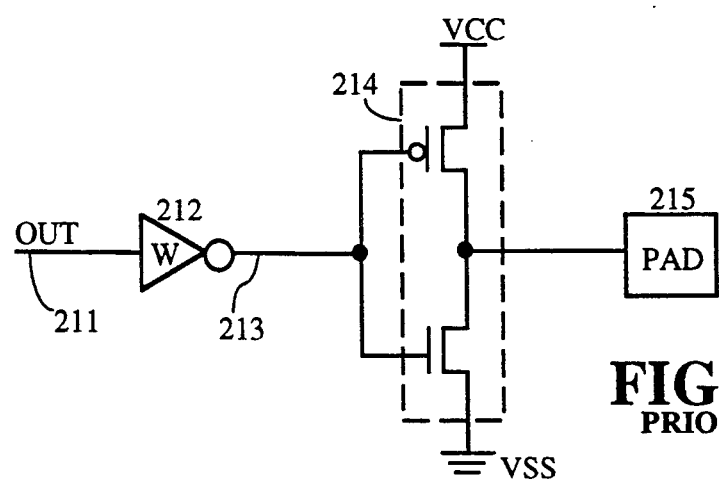
Figure 2C:
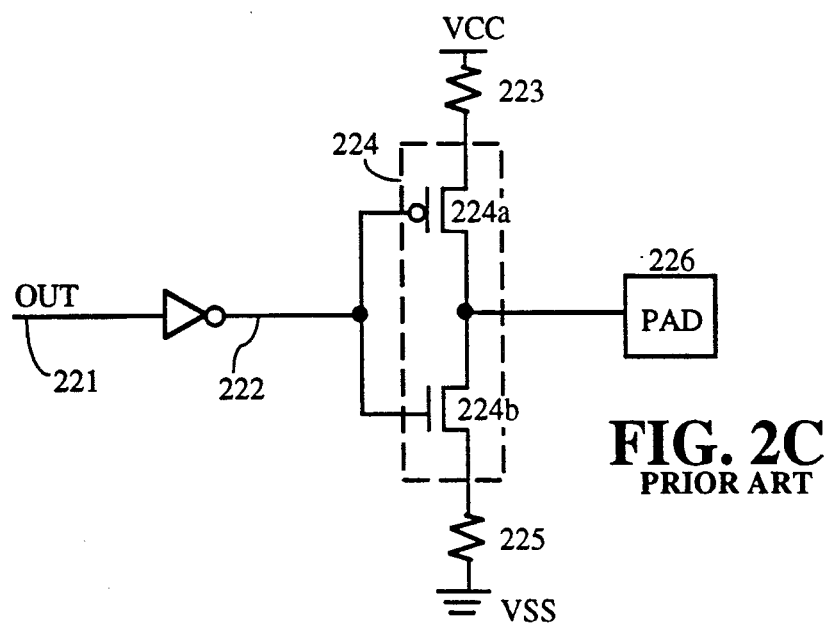

FIGS. 3A and 3B show two types of loads typically driven by an output circuit of an integrated circuit device. As shown in FIG. 3A an output signal is buffered through a CMOS inverter 214, through a pad 215, and to a load which comprises capacitor C301 and a resistor divider network comprising resistors R301 and R302. FIG. 3B, on the other hand, uses a load which primarily comprises capacitor C302. These two types of loads have different effects on the voltage levels in the integrated circuit driving the loads and require very different output buffers to drive these two types of loads in order to minimize the variation in power and ground voltages of the integrated circuit. In the case of FIG. 3A, the resistor divider network formed from resistors R301 and R302 reduces variation in power and ground voltage by limiting the initial current and by maintaining current at the end of the transition, the current path being through one of resistors R301 and R302. Initial current is limited by the series resistor according to the well-known formula $I=V/R$. At the end of a transition, the DC current through one of the resistors R301 or R302 prevents any sharp discontinuity of current with resulting ground bounce. For the type of load shown in FIG. 3A, output driver circuit 214 must be strong enough to switch the voltage at the load quickly and to sink enough current to pull the resistor network voltage down to an acceptable level. Any of the prior art techniques will work for resistive-capacitive loads such as shown in FIG. 3A.

Figure 1:
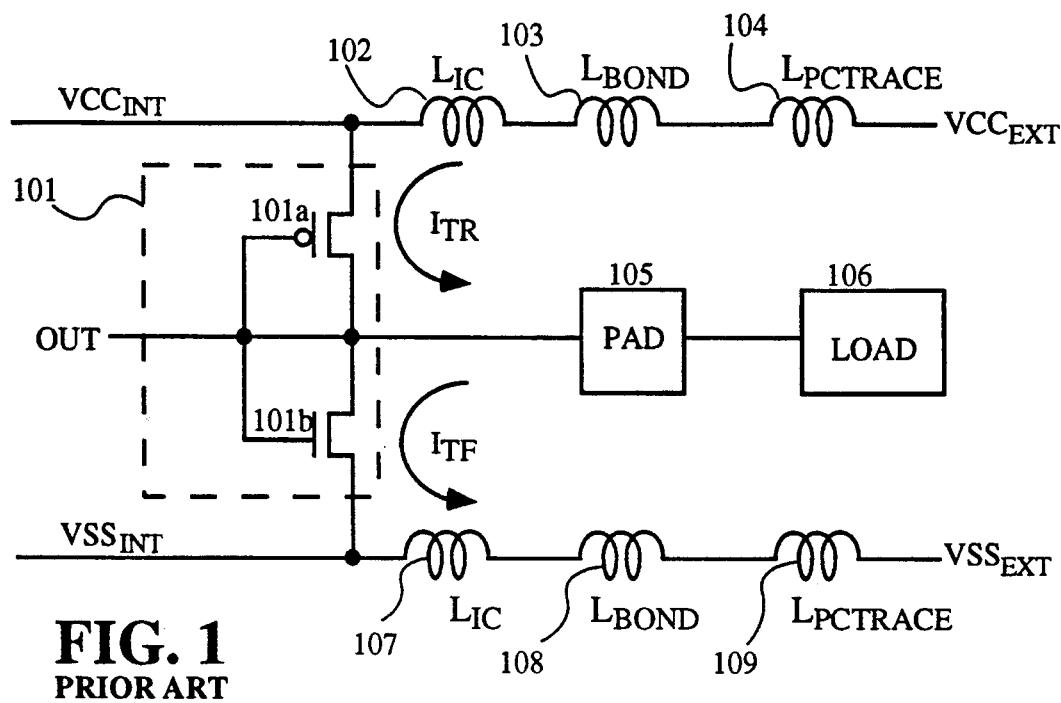
FIG. 1 shows an output driver circuit and load, with inherent inductive elements included.

In the case of a capacitive load, such as capacitor C302 shown in FIG. 3B, the load supplies current from stored charge. At the end of a switching transition, inductors such as shown in FIG. 1 tend to maintain current flow, and since there is no current path through the load, voltage at capacitor C302 swings past an equilibrium voltage, producing the condition commonly described as "ground bounce." The present invention applies particularly to loads such as shown in FIG. 3B. To minimize ground bounce, the drive capability of the output devices begins to be reduced as the switching event completes.

Figure 4A:
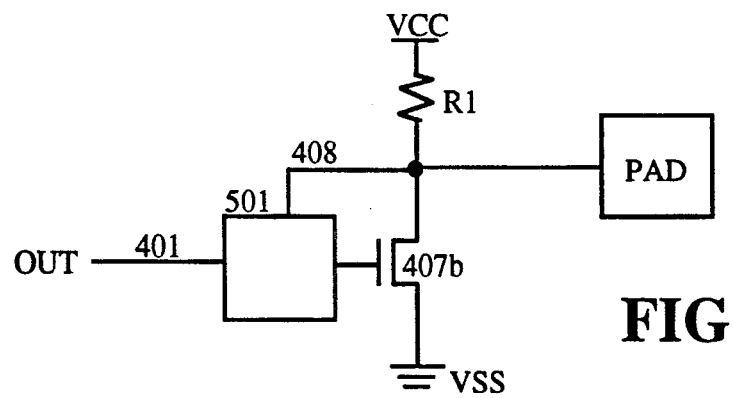
FIGS. 4A-4G show circuits according to the present invention for reducing variation in ground voltage when switching.

FIGS. 4A through 4H show several embodiments of the present invention which can handle pure capacitive loads. The simplest case is shown in FIG. 4A. As shown in FIG. 4A, an unbuffered output signal on line 401 is applied to a gating device 501. Gating device 501 also receives feedback on line 408 from the buffered output signal applied to the pad. Gating device 501 is of a type which gradually reduces the voltage on the gate of transistor 407b in response to a decreasing output voltage on line 408 which results when the signal OUT goes high on line 401. This causes transistor 407b to turn off gradually as the pad voltage decreases. This in turn prevents the load capacitance associated with the pad in combination with inductances associated with the ground line from producing a disturbance in the ground voltage at VSS.

Figure 4B:
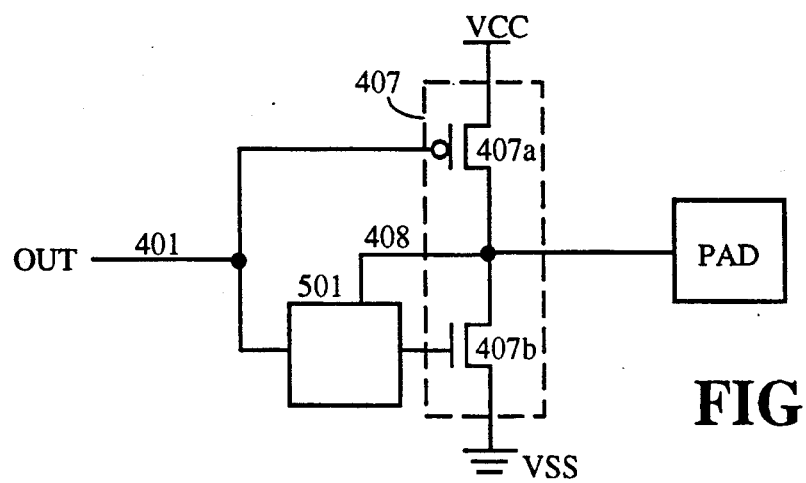

FIG. 4B shows another embodiment of the invention in which resistor R1 is replaced with P-channel transistor 407A in a conventional CMOS output driver. In another embodiment (not shown), resistor R1 can be replaced with an N-channel pull-up transistor controlled through an inverter. The function of device 501 and transistor 407b is the same as described in connection with FIG. 4A.

Figure 4C:
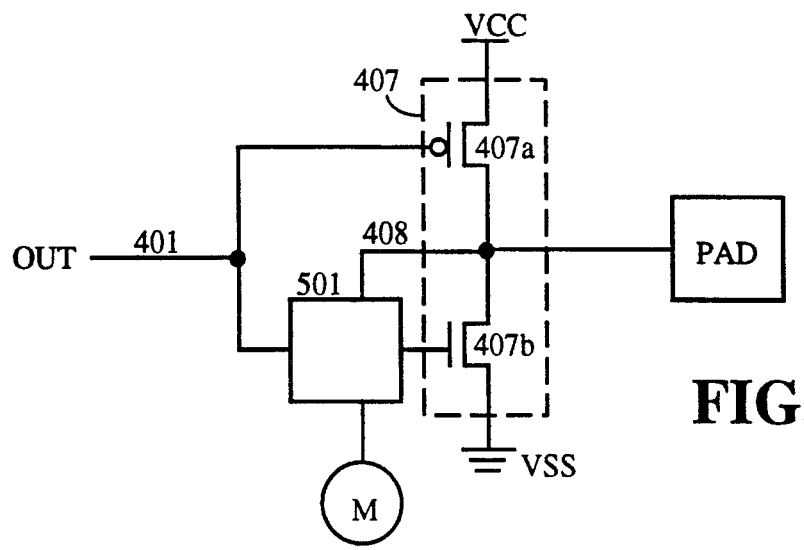

In FIG. 4C device 501 is controlled by memory cell M such that in one state transistor 407b is turned off gradually in response to a signal on line 408 and in another state, transistor 407b is controlled only in response to a signal on line 401. This memory cell may be an SRAM cell, that is, a volatile cell which is typically loaded when the chip is powered up. Alternatively, memory cell M may be one or two antifuses which programmably connect a multiplexer control line to either power or ground. Likewise, memory cell M could be an EPROM cell (a nonvolatile cell) or it could be two selectable vias, one of which is formed during manufacture of the device to connect the multiplexer to the appropriate voltage source.

Figure 4D:
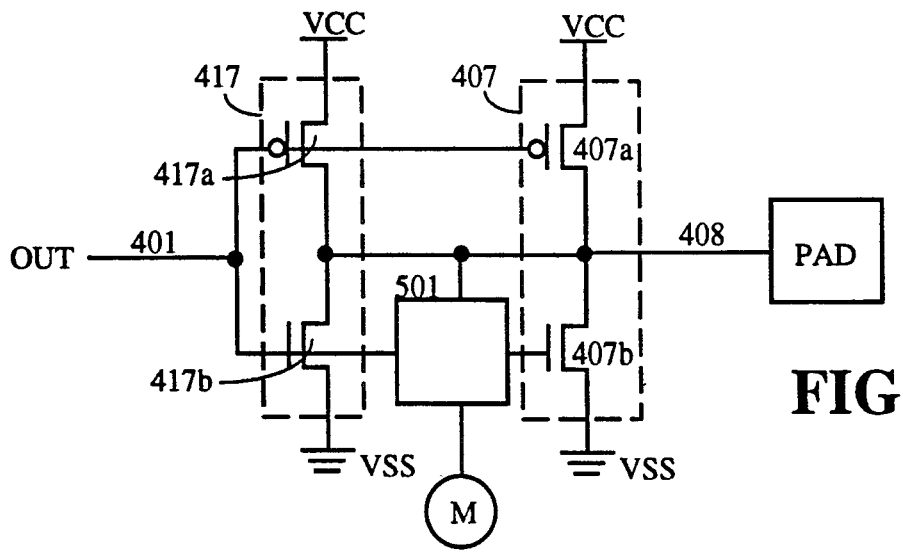

FIG. 4D shows a further implementation in which a second output driver 417 is controlled in a conventional manner by an output signal on line 401. In this embodiment transistor 407b is a relatively large transistor which pulls down the pad quickly in response to an increasing voltage on line 401. Output driver 417 includes small transistors 417a and 407b. When transistor 407b turns off due to the feedback through control device 501, the voltage on line 408 is held low by transistor 417b, which remains on in response to the high voltage on line 401.

Figure 4E:
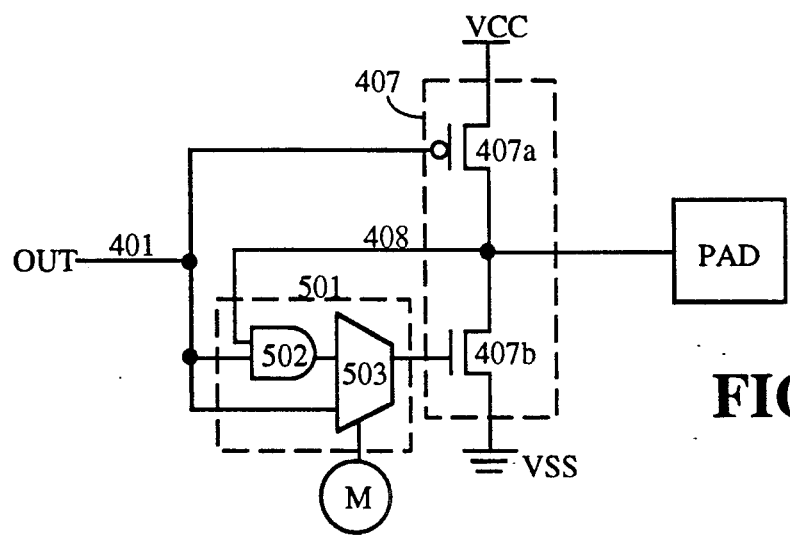

FIG. 4E shows an embodiment of the control device 501 which Comprises multiplexer 503 in combination with AND gate 502. AND gate 502 receives input signals from line 408 and line 401. If either of these signals is low, the output of AND gate 502 is low. A logical one in memory cell M causes multiplexer 503 to pass the output signal from AND gate 502 to the gate of transistor 407b. In response to a falling signal on line 408, a falling signal out of multiplexer 503 causes transistor 407b to turn off gradually, preventing ground bounce.

If memory cell M carries a logic 0, the signal on line 401 is passed directly to the gate of transistor 407b, and therefore controls transistor 407b without regard to the voltage on line 408. The embodiment of FIG. 4E is useful when the circuit will be driving either of the load devices shown in FIGS. 3A and 3B. For driving the load device in FIG. 3A, memory cell M is loaded with a logical 0 such that transistor 407b is controlled directly by a signal on line 401. When the load device is a capacitive load such as shown in FIG. 3B, memory cell M is loaded with a logical one and causes multiplexer 503 to produce the gradually decreasing voltage on the gate of transistor 407b in response to the decreasing voltage on line 408.

Figure 4F:
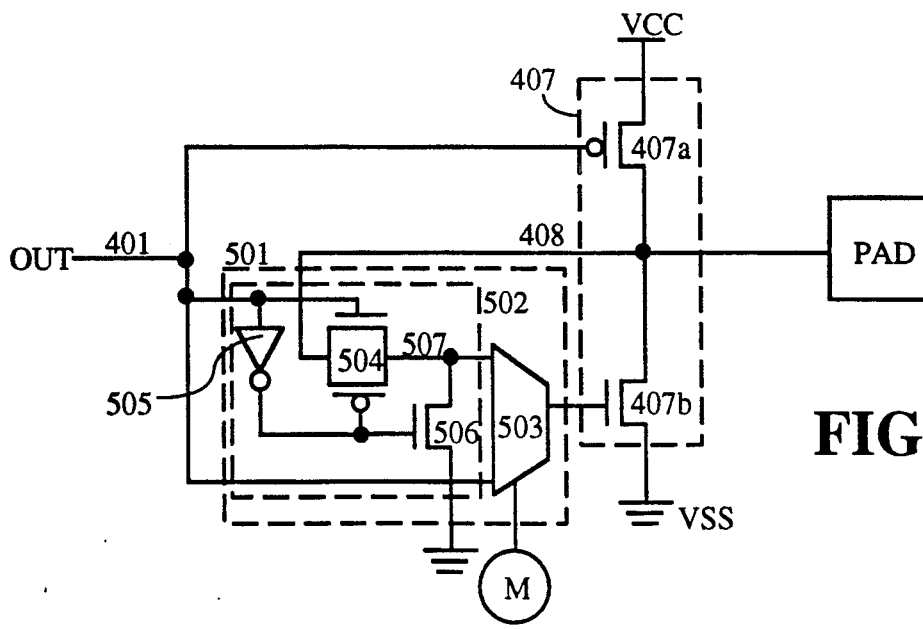

FIG. 4F shows a particular implementation of AND gate 502, comprising transmission gate 504 and pull down transistor 506. Pull down transistor 506 turns on when transmission gate 504 is off, preventing a floating input on line 507 in the case where line 401 is a logical 0. As the signal on line 401 moves to logical 1, and as line 408 moves toward the voltage VSS, the lowering voltage on line 507 is passed by multiplexer 503 to the gate of transistor 407b, turning this transistor gradually off such that the variation in voltage level VSS is minimized. Note that if transistor 407b is fully off, and transistor 506 is off, that line 507 which controls multiplexer 503 and the gate to transistor 407b can be left floating, because the gate to transistor 407b floats to a high enough voltage to turn transistor 407b partly on, the corresponding decrease in voltage on line 408 again lowers the voltage on line 507. Thus no intermediate voltages persists.

Figure 4G:
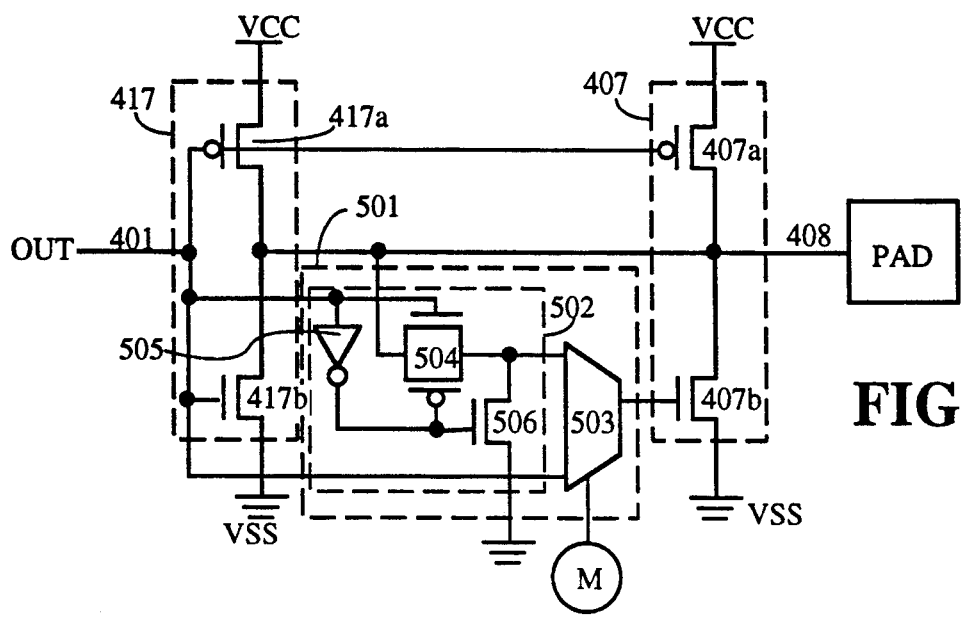

FIG. 4G shows an embodiment in which the implementation of FIG. 4F is combined with a second output driving device such as shown in FIG. 4D. Small transistors 417a and 417b pull the output voltage to the rails and prevent the drifting of output voltage which occurs with the single stage of FIG. 4F.

Figure 4H:
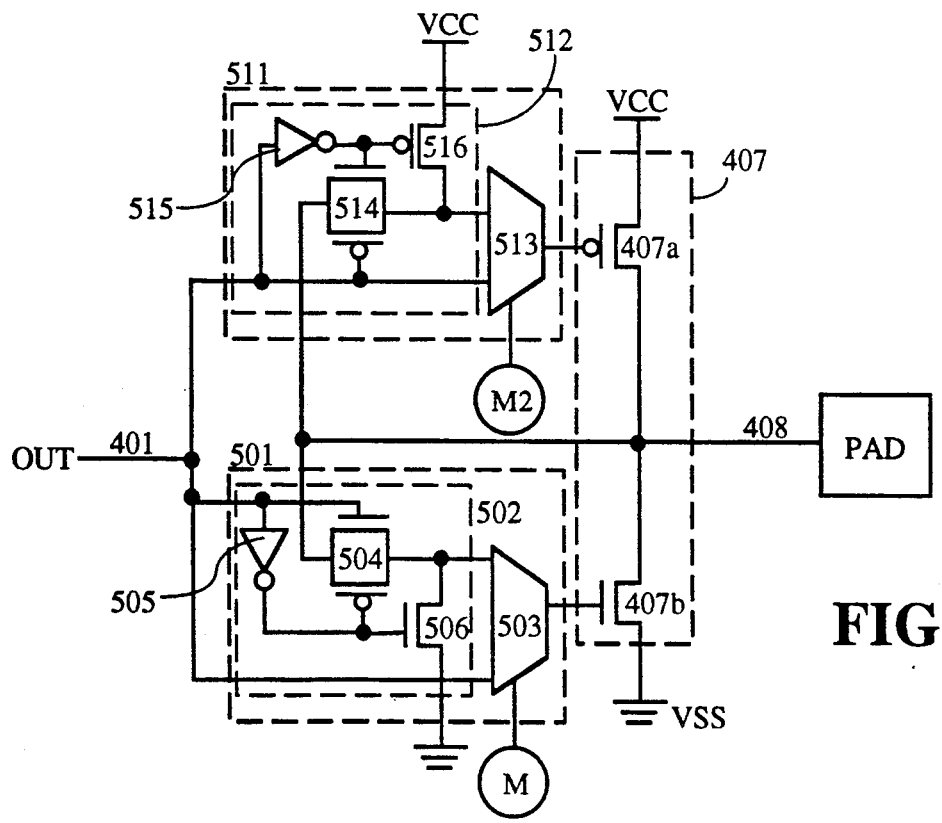
FIG. 4H shows a circuit according to the present invention for reducing variations in both power and ground voltage when switching.

FIG. 4H shows yet another embodiment in which both ground voltage and power voltage are controlled by a gradual turn off device such as discussed earlier in connection with the ground voltage only. Elements 511–516 correspond to elements 501–506 respectively.

Figure 4I:
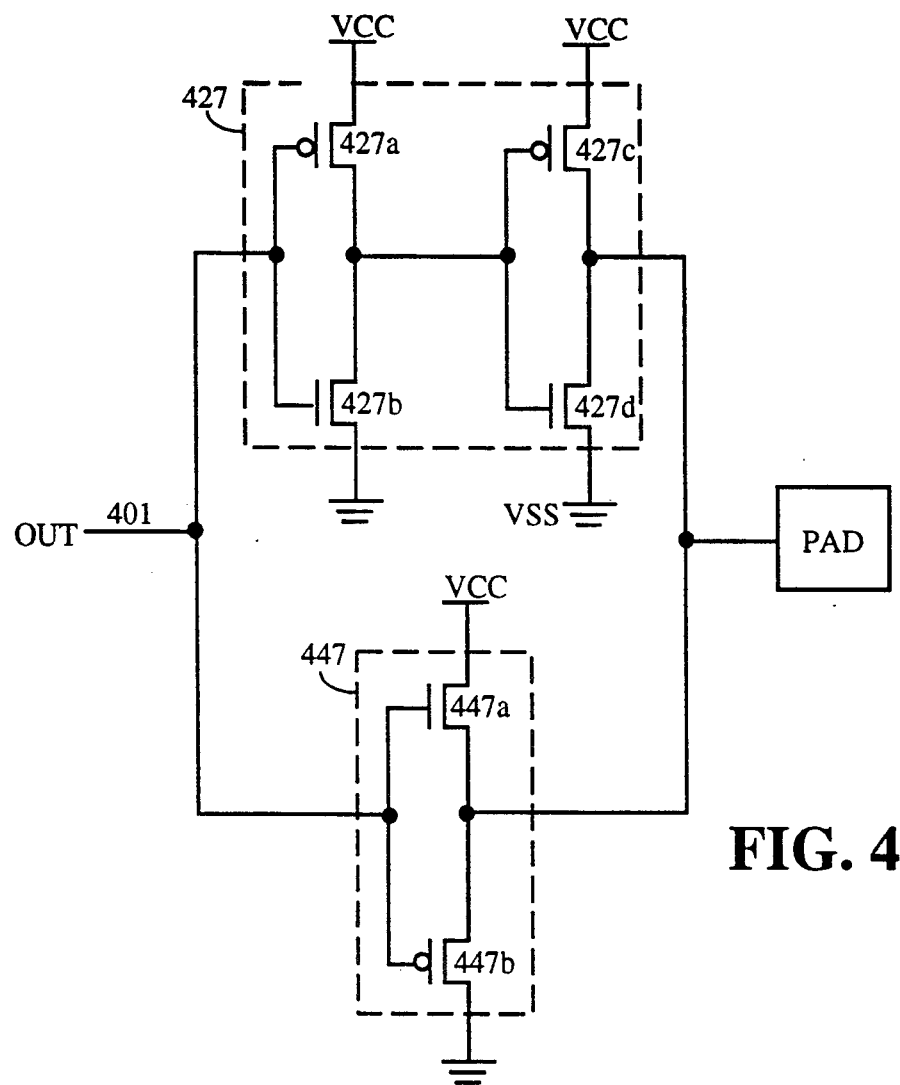
FIG. 4I shows another circuit for reducing bounce in both the internal VCC and VSS supplies.

FIG. 4I shows another circuit for reducing bounce in both the internal VCC and VSS supplies. The primary output driver 447 differs from a standard CMOS inverter by having the P-channel transistor 447b connected to ground and the N-channel transistor 447a connected to the positive voltage supply. The circuit is a non-inverting buffer and does not pull the output voltage to the rails. To pull the output to the rails, a smaller secondary driver 427 comprising two standard CMOS inverters is provided. Circuit 427 pulls the pad voltage to one of VCC or VSS, but because transistors in circuit 427 are smaller than in circuit 447, the current through circuit 427 is low and the ground bounce of this circuit is small. Since drive current through circuit 447 is reduced before output voltage reaches its final value, the ground bounce of the circuit of FIG. 4I is reduced.

Figure 5A:
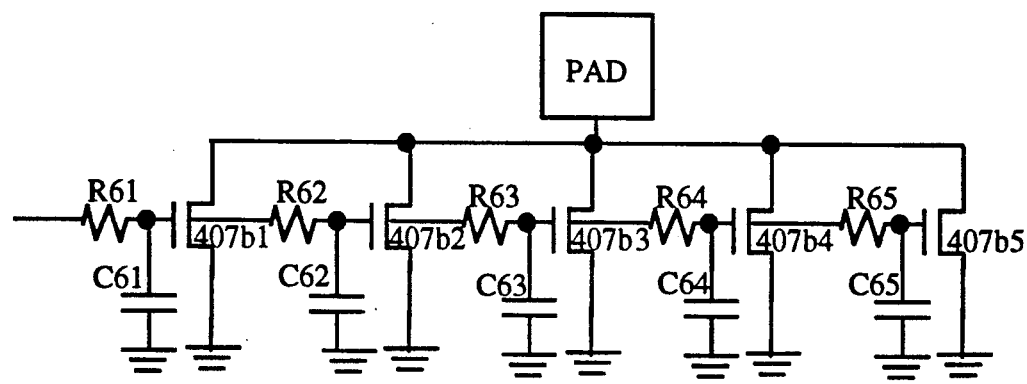
FIG. 5A shows a prior art circuit for reducing bounce when a circuit begins switching which is preferably used in combination with one of the circuits of FIG. 4A to 4I.

Actually, to minimize ground (and power) bounce, it is necessary that the current flow both begin slowly and end slowly. The present invention relates to assuring that the current flow ends slowly. Prior art circuits such as shown in FIG. 5A cause the current to begin slowly so that no appreciable ground bounce occurs on either the beginning or the end of a transition. Such a circuit is preferably used in combination with one of the circuits of FIG. 4A to 4I.

Figure 5B:
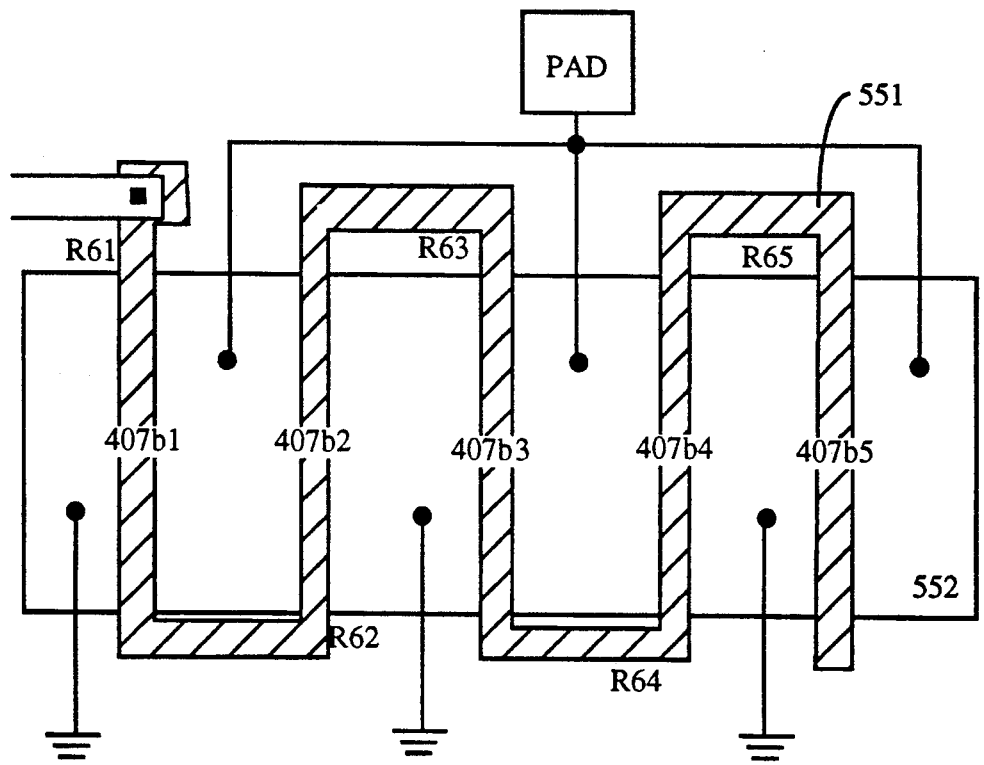
FIG. 5B shows the preferred layout of the circuit of FIG. 5A.

FIG. 5B shows the preferred layout of the circuit of FIG. 5A. The output transistor such as 407b is implemented as a set of parallel transistors 407b1 through 407b5, and the gates of these transistors are formed as a single polycrystalline silicon line 551, which is resistive, as represented by resistors R61 through R65. There is capacitance between the gate 551 and the N-diffusion in which the transistor sources and drains are formed. This capacitance is represented by capacitors C61 through C65. This combination of resistance and capacitance produces a delay between the turn-on of transistor 407b1 and the turn-on of transistor 407b5. Thus ground bounce at the turn-on of transistor 407b is minimized by laying out transistor 407b as shown in FIG. 5B.

Figure 6A:
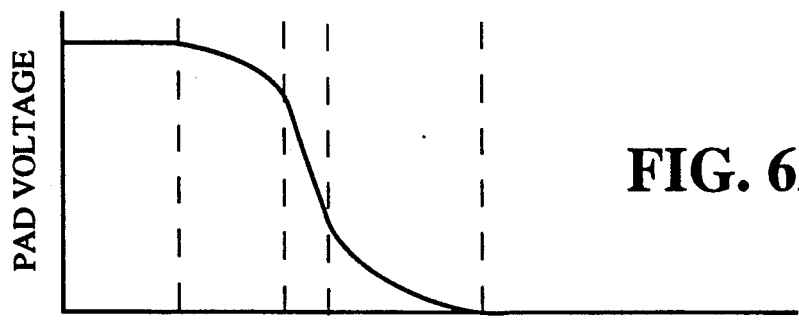
FIGS. 6A, 6B, and 6C shows curves for, respectively, output (pad) voltage, pad current, and internal ground voltage $VSS_{INT}$ as functions of time.
Figure 6B:
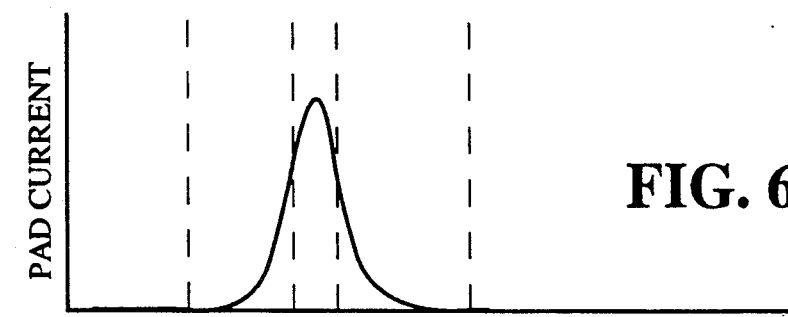
Figure 6C:
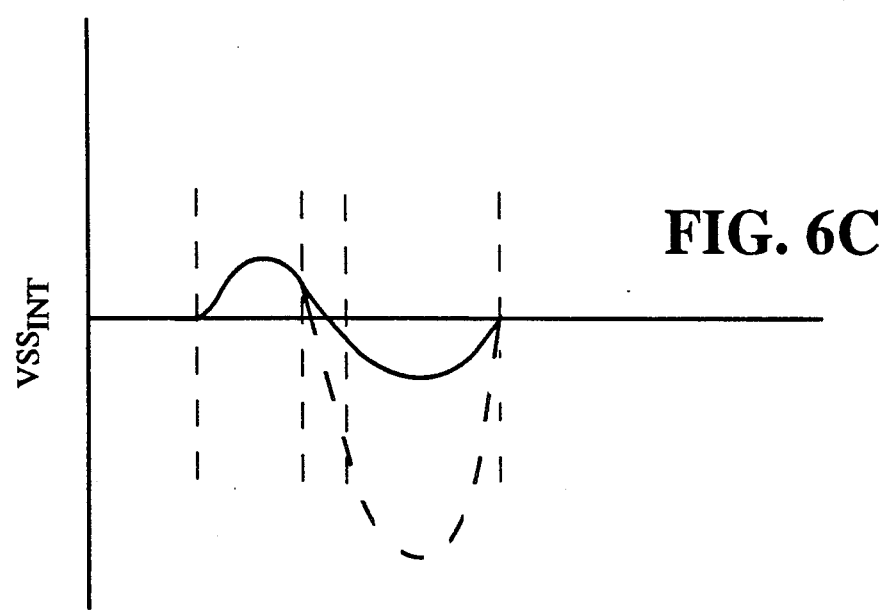

The combination of the present invention with the prior art implementation of FIG. 5B is illustrated in FIGS. 6A, 6B, and 6C. These curves show, respectively, output (pad) voltage, pad current, and internal ground voltage $VSS_{INT}$ as functions of time. The dotted line in FIG. 6C is included to illustrate the resulting bounce which would occur if the present invention were not used.

In light of the several embodiments illustrated above, other embodiments will become obvious to those skilled in the art and are intended to be included in the scope of the present invention.

We claim:

1. A structure for reducing variation in power supply voltage in an integrated circuit device comprising:
   an output driver circuit comprising
      at least one output drive transistor (407b) having current carrying terminals connected between an output terminal (408) and a first power supply terminal (gnd) having a first power supply voltage;
      means (R1 or 407a) for supplying a second power supply voltage to said output terminal;
      means (501 or 502) for controlling said output drive transistor, said means for controlling being responsive to an unbuffered output signal (401) and to a voltage at said output terminal (408); and
      means (M) for selecting between causing said output drive transistor (407b) to respond only to said unbuffered output signal (401) and causing said output transistor to respond to both said unbuffered output signal (401) and said voltage at said output terminal (408).

2. A structure for reducing variation in power supply voltage as in claim 1 in which said means for causing said means for controlling said output drive transistor to respond only to said unbuffered output signal comprises:
   a multiplexer (503); and
   a logic gate (502) which receives at one terminal an output signal from said output terminal and at another terminal said unbuffered output signal, and provides a signal to said multiplexer; wherein
   said multiplexer in a first state passes said output signal from said logic gate to a control terminal of said output drive transistor and in a second state passes said unbuffered output signal to said control terminal of said output drive transistor.

3. A structure for reducing variation in power supply voltage as in claim 2 in which said multiplexer is controlled by a memory cell.

4. A structure for reducing variation in power supply voltage as in claim 3 in which said memory cell is an SRAM cell.

5. A structure for reducing variation in power supply voltage as in claim 3 in which said memory cell is at least one antifuse connected to a voltage source.

6. A structure for reducing variation in power supply voltage as in claim 3 in which said memory cell is a nonvolatile EPROM cell.

7. A structure for reducing variation in power supply voltage as in claim 3 is which said memory cell is at least one optional via which connects to a voltage source.

8. A structure for reducing variation in power supply voltage as in claim 2 in which said logic gate comprises an AND gate, said AND gate comprising:
- a CMOS transmission gate having its control terminal connected to said unbuffered output signal and its input terminal connected to said output terminal of said output driver circuit, and having an output terminal;
- a pull-down transistor having a current carrying terminal connected to said output terminal of said CMOS transmission gate and another current carrying terminal connected to ground, and a control terminal connected through an inverter to said unbuffered output signal.

9. A structure for reducing variation in power supply voltage in an integrated circuit device comprising:
- a first output driver circuit comprising
  - at least one output drive transistor (407b) having current carrying terminals connected between an output terminal (408) and a first power supply terminal (gnd) having a first power supply voltage;
  - means (R1 or 407a) for supplying a second power supply voltage to said output terminal;
  - means (501 or 502) for controlling said output drive transistor, said means for controlling being responsive to an unbuffered output signal (401) and to a voltage at said output terminal (408);
- a second output driver circuit comprising:
  - at least one second output driver transistor (417b) having current carrying terminals connected between said output terminal 9408) and said first power supply terminal and a control terminal controlled by said unbuffered output signal.

* * * * *

UNITED STATES PATENT AND TRADEMARK OFFICE
CERTIFICATE OF CORRECTION

PATENT NO. : 5,319,252
DATED : June 7, 1994
INVENTOR(S) : Kerry M. Pierce, et al It is certified that error appears in the above-indentified patent and that said Letters Patent is hereby corrected as shown below:

Col. 4, line 66, "Comprises" should read --comprises--.

Col. 5, line 34, "because the" should read --because if the--.

Claim 9, Col. 8, line 22, "9408)" should read --(408)--.

Signed and Sealed this

Nineteenth Day of September, 1995

Attest:

BRUCE LEHMAN

Attesting Officer

Commissioner of Patents and Trademarks